US011009538B2

(12) United States Patent
Lin et al.

(10) Patent No.: US 11,009,538 B2
(45) Date of Patent: May 18, 2021

(54) MICRO RESONATOR ARRAY SYSTEM

(71) Applicant: APPLIED MATERIALS, INC., Santa Clara, CA (US)

(72) Inventors: Chuang-Chia Lin, San Ramon, CA (US); Upendra Ummethala, Cupertino, CA (US); Andrew Choe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 50 days.

(21) Appl. No.: 16/283,371

(22) Filed: Feb. 22, 2019

(65) Prior Publication Data
US 2019/0265288 A1  Aug. 29, 2019

Related U.S. Application Data

(60) Provisional application No. 62/636,071, filed on Feb. 27, 2018.

(51) Int. Cl.
*G01R 29/08* (2006.01)
*H01L 21/66* (2006.01)
*H01Q 1/38* (2006.01)

(52) U.S. Cl.
CPC ..... *G01R 29/0878* (2013.01); *G01R 29/0892* (2013.01); *H01L 22/12* (2013.01);
(Continued)

(58) Field of Classification Search
CPC .................. G01R 29/0878; G01R 29/0892
See application file for complete search history.

(56) References Cited

U.S. PATENT DOCUMENTS 7,830,311 B2 * 11/2010 Kataya ................ H01Q 1/2225
343/700 MS
8,106,723 B2 * 1/2012 Watanabe .......... H03H 9/02409
331/116 M
(Continued)

FOREIGN PATENT DOCUMENTS

CN  101715615  5/2010
CN  102210059  10/2011
(Continued)

OTHER PUBLICATIONS

International Search Report and Written Opinion from PCT/US2019/019464 dated Jun. 13, 2019, 20 pgs.
(Continued)

*Primary Examiner* — Reena Aurora
(74) *Attorney, Agent, or Firm* — Schwabe, Williamson & Wyatt, P.C.

(57) ABSTRACT

Embodiments include systems and methods for determining a processing parameter of a processing operation utilizing micro resonator sensors. Some embodiments include a diagnostic substrate comprising a substrate, a circuit layer over the substrate, a cavity in the circuit layer, a capping layer over the circuit layer, a resonating body in or over the cavity, one or more electrodes in the cavity, and circuitry for driving and sensing the resonant frequency of the resonating body. In an embodiment, the circuitry comprises a biasing circuitry block configured to provide a bias voltage to the one or more electrodes, a frequency generator circuitry block configured to provide a signal with a varying frequency to the one or more electrodes, and a sensing circuitry block configured to detect a value correlated to oscillation of the resonating body.

19 Claims, 9 Drawing Sheets

(52) U.S. Cl.
CPC .............. *H01L 22/14* (2013.01); *H01L 22/34* (2013.01); *H01Q 1/38* (2013.01)

(56) References Cited

U.S. PATENT DOCUMENTS

| | | |
|---|---|---|
| 10,571,437 B2 * | 2/2020 | Morton .............. G01N 29/2443 |
| 2012/0245724 A1 | 9/2012 | Erturk et al. |
| 2013/0257487 A1 | 10/2013 | Opris et al. |
| 2013/0320098 A1 * | 12/2013 | Mukai ................ G06K 19/0775 235/492 |
| 2014/0038662 A1 | 2/2014 | Alberth, Jr. et al. |
| 2017/0033761 A1 | 2/2017 | Huang et al. |
| 2017/0221775 A1 | 8/2017 | Tedeschi et al. |

FOREIGN PATENT DOCUMENTS

| | | |
|---|---|---|
| CN | 103178325 | 6/2013 |
| TW | 201738984 | 11/2017 |

OTHER PUBLICATIONS

Official Letter from Taiwan Patent Application No. 108106711 dated Jan. 14, 2020, 6 pgs.
International Preliminary Report on Patentability for PCT/US2019/019464 dated Sep. 3, 2020, 7 pgs.

* cited by examiner

MICRO RESONATOR ARRAY SYSTEM

CROSS-REFERENCE TO RELATED APPLICATIONS

This application claims the benefit of U.S. Provisional Application No. 62/636,071, filed on Feb. 27, 2018, the entire contents of which are hereby incorporated by reference herein.

BACKGROUND

1) Field

Embodiments relate to the field of semiconductor manufacturing and, in particular, to systems and methods for monitoring processing parameters of semiconductor fabrication operations. Embodiments include arrays of micro resonators that are monitored for changes in resonance frequency at various resonance modes.

2) Description of Related Art

The scale of critical dimension (CD) and other feature sizes in many semiconductor devices is continually shrinking. Extensive process development is needed in order to develop reliable processes with high repeatability. Typically, a process is developed by running the process on test substrates. The test substrates are then analyzed with various metrology tools in order to determine the results of the process. For example, cross-sections of the substrate may be analyzed to determine the amount of material removed with an etching process or material added with a deposition process.

The use of such test substrates and post processing metrology has several drawbacks. One drawback is that the cross-sectioning and analysis takes significant time (e.g., days or longer). Additionally, the cross-sectioning requires significant work for each location. As such, only a limited number of cross-sections can be analyzed for each process. Another drawback is that only the end result of the process is able to be analyzed. This limits the information that may be obtained about the process. For example, the rate of change of a process is not determinable from the end result of cross-sections of the test substrate.

SUMMARY

Embodiments include systems and methods for determining a processing parameter of a processing operation utilizing micro resonator sensors. Some embodiments include a diagnostic substrate comprising a substrate, a circuit layer over the substrate, a cavity in the circuit layer, a capping layer over the circuit layer, a resonating body in or over the cavity, one or more electrodes in the cavity, and circuitry for driving and sensing the resonant frequency of the resonating body. In an embodiment, the circuitry comprises a biasing circuitry block configured to provide a bias voltage to the one or more electrodes, a frequency generator circuitry block configured to provide a signal with a varying frequency to the one or more electrodes, and a sensing circuitry block configured to detect a value correlated to oscillation of the resonating body.

Additional embodiments include a device for wirelessly coupling to a diagnostic substrate that has a micro resonator. In an embodiment, the device comprises a frequency source for generating a drive signal that is transmitted to the micro resonator, and a phase tuning circuitry block. In an embodiment, the phase tuning circuitry block corrects phase mismatch of a frequency response generated by the micro resonator in response to the drive signal. In an embodiment, the device further comprises a sensing circuitry block. In an embodiment, the sensing circuitry block is configured to detect a change in a value correlated to the frequency response received from the micro resonator.

Additional embodiments include a diagnostic system for determining processing parameters of a process. In an embodiment, the diagnostic system comprises a diagnostic substrate and an interrogation device. In an embodiment, the diagnostic substrate comprises a substrate, a circuit layer over the substrate, and a plurality of micro resonators over or in the circuit layer. In an embodiment, the interrogation device is external to the diagnostic substrate is configured to be wirelessly coupled to the diagnostic substrate to drive and sense the plurality of micro resonators.

DETAILED DESCRIPTION

Systems and methods described herein include diagnostic substrates for monitoring processing parameters of a processing operation. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, the current timeline for developing a processing operation, such as an etching process or a deposition process, is long due to the labor intensive metrology needed to determine processing parameters. Embodiments described herein accelerate the process development by using diagnostic substrates. Diagnostic substrates described herein include a plurality of micro resonator sensors distributed across the substrate. Accordingly, process parameters and their degree of uniformity across the substrate surface may be obtained without requiring many cross-sections.

In some embodiments the plurality of micro resonator sensors may be grouped into sensing regions across the substrate surface. For example, hundreds of sensing regions, each including thousands or tens of thousands of micro resonator sensors, may be formed on the diagnostic substrate. In such embodiments, the micro resonators in each sensing region may be used to provide a high signal to noise ratio. Accordingly, embodiments allow for high resolution even when dealing with critical dimensions (CD) at the tens of nanometer scale. In some embodiments, changes in CD in the range of angstroms to several nanometers with an accuracy in the parts per million (PPM) may be detected.

Furthermore, embodiments may include diagnostic substrates that may be utilized to provide in-situ monitoring of the processing operation. In-situ monitoring allows for monitoring processing parameters during the processing operation. As such the rate of change of a processing parameter may be determined as well. Embodiments may include a wireless module that transmits information from the diagnostic substrate in real time. Alternatively, the information from the micro resonator sensors may be stored in a memory on the diagnostic substrate and processed subsequent to the processing operation.

Figure 1A:
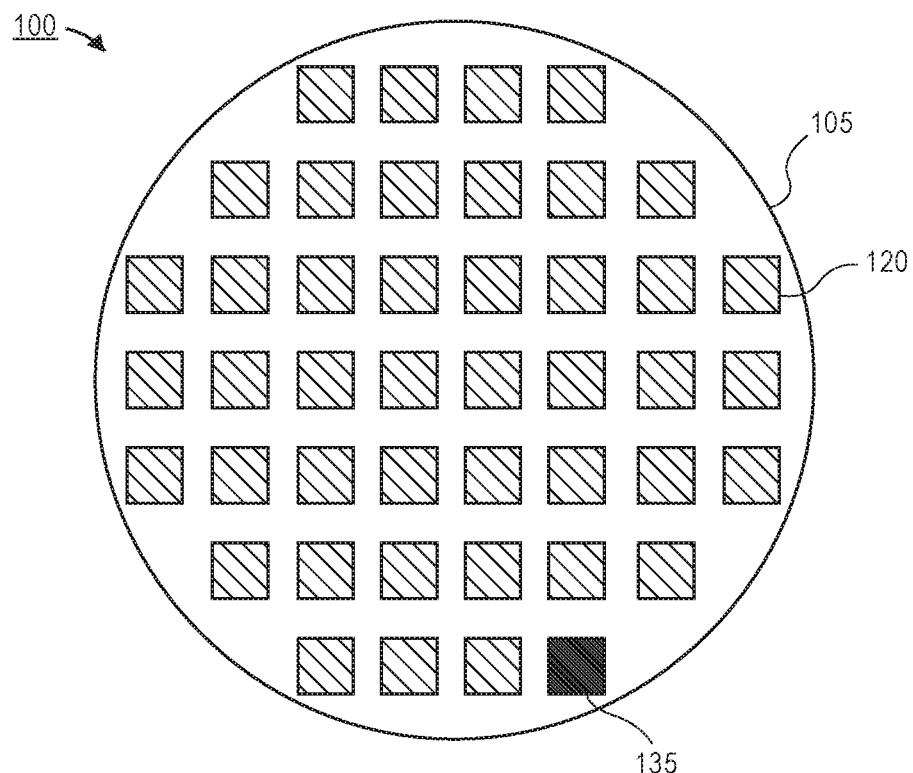
FIG. 1A is a schematic plan view of sensing regions on a substrate, in accordance with an embodiment.

Referring now to FIG. 1A, a schematic plan view illustration of a diagnostic substrate 100 is shown, in accordance with an embodiment. In an embodiment, the diagnostic substrate 100 may be formed on a substrate 105. The substrate 105 may be any suitable substrate on which sensing regions 120 may be fabricated. For example, the substrate 105 may be a semiconductor substrate, such as silicon, a silicon on insulator (SOI), a glass substrate, or the like. In an embodiment, the substrate 105 may be considered a wafer (e.g., a 300 mm silicon wafer or the like). The substrate 105 may be substantially the same dimensions as a production substrate used to fabricate functioning devices using a processing operation being developed with the diagnostic substrate 100. Furthermore, the diagnostic substrate 100 may comprise a surface that matches that of device substrates. For example, the exposed surface (i.e., across the entire substrate including the sensing regions 120) may comprise a single crystalline silicon (or other semiconductor) material. Such a pristine surface allows for low surface roughness, suitable for providing measurements of CD at the angstrom to nanometer scales. Furthermore, since the surface of the diagnostic substrate 100 matches that of device substrates on which functioning semiconductor devices are fabricated, accurate comparison to typical semiconductor processing operations may be provided.

Additionally, while referred to as a diagnostic substrate, it is to be appreciated that embodiments may also include sensing regions 120 on device substrates. In such embodiments, the sensing regions 120 may be used during the fabrication of functioning devices in order to provide metrology or other quality control measures concurrent with the device fabrication.

According to an embodiment, the diagnostic substrate 100 may include a plurality of sensing regions 120. The sensing regions 120 may be distributed across the surface of the substrate 105. Including sensing regions 120 at different locations allows the uniformity of a processing operation to be determined. It is to be appreciated that the sensing regions 120 illustrated in FIG. 1A are exemplary in nature. The sensing regions 120 may be of any number and in any distribution over the surface of the substrate 105. In some embodiments, there may be more than one hundred sensing regions 120 distribute over the surface of the substrate 120.

Embodiments may also include one or more processing regions 135 on the diagnostic substrate 100. In an embodiment, the processing regions 135 may be communicatively coupled to the sensing regions (e.g., with conductive traces, vias or the like). In an embodiment, the processing regions 135 may include circuitry, logic modules, memory modules, signal processing modules, communication modules, or the like. The processing regions 135 may be used to drive electrodes (described in greater detail below) that will drive the resonance of flexible diaphragms in micro resonators in each sensing region 120. The processing regions 135 may record resonant frequencies of each micro resonator. The processing regions 135 may also determine a processing parameter from the resonant frequencies using methods described in greater detail below. In other embodiments, the determination of the processing parameters from the resonant frequencies may be implemented on a computing system external to the diagnostic substrate. For example, the raw (or processed) data from each micro resonator may be transmitted (e.g., with a wireless communication module) to an external device for further analysis. In an embodiment, the communication link may be implemented using RF (e.g., WiFi, Bluetooth, etc.), acoustic communications, inductive communication, or optical communication (e.g., fiber optics), or any other suitable communication protocol.

In some embodiments, the diagnostic substrate 100 may comprise only passive components. That is, the diagnostic substrate 100 may comprise micro resonators that are communicatively coupled to an external device with an antenna or the like. The micro resonators may be driven and sensed with the external device. For example, a wireless link for transmitting power and data between the external device and the micro resonators may be provided on the diagnostic substrate 100.

In the illustrated embodiment, the processing region 135 is illustrated as being formed on a top surface of the substrate 105. However, it is to be appreciated that the processing regions 135 may be embedded within the substrate 105 or formed on a backside surface of the substrate 105. In an embodiment, the processing region 135 may also include a power source. For example, the power source may be a battery, or the like. In other embodiments, the power source may be a wireless power source. For example, the power source may comprise conductive coils, antennas, or the like to enable inductive power coupling or an acoustic power coupling. In some embodiments, the wireless power source may also be configured to provide a data link. That is, frequencies of the micro resonators may be transmitted to an external device using wireless coupling (e.g., acoustic coupling, inductive coupling, etc.).

Figure 1B:
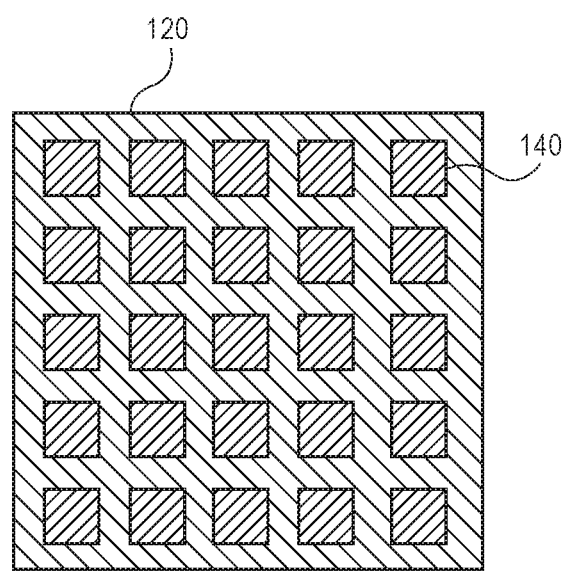
FIG. 1B is a zoomed in schematic plan view of a sensing region illustrating an array of micro resonator sensors, in accordance with an embodiment.

Referring now to FIG. 1B, a zoomed in schematic illustration of a sensing region 120 is shown, in accordance with an embodiment. Each sensing region 120 may include a plurality of micro resonator sensors 140. In the illustrated embodiment, twenty-five micro resonator sensors 140 are shown for simplicity. However, it is to be appreciated that thousands of micro resonator sensors 140 may be formed in each sensing region 120. For example, each of the micro resonator sensors 140 may have a surface area of approximately 50 $\mu m^2$. In such embodiments, forty thousand micro resonator sensors 140 may be formed in a sensing region of 100 $mm^2$. It is to be appreciated that the dimensions and number of micro resonator sensors 140 and the dimensions of the sensing regions 120 are exemplary in nature, and embodiments include micro resonators with dimensions greater than or less than 50 $\mu m^2$ and sensing regions with dimensions greater than or less than 100 $mm^2$.

The large number of micro resonator sensors 140 in each sensing region 120 allows for high signal to noise ratios through noise reduction. As such, small changes to the processing parameter being investigate may be determined. For example, changes of angstroms to several nanometers in the CD of an etched structure may be discernable, in accordance with embodiments described herein. Embodiments described herein may include micro resonator sensors that have resonance frequencies of tens of MHz. In such resonators, trenches with a 1:1 trench:ridge ratio with a depth of 50 nm may induce a shift in the resonance frequency of approximately 1 to 2 MHz. Furthermore, small changes (e.g., angstroms to nanometers) to the width of the trench may induce a resonance change of approximately 10 Hz to 1,000 Hz. Similarly, variations in temperature, surface potential, and/or pressure also drive resonance changes. For example, a single degree of temperature change may produce change in resonance frequency between 10 Hz and 1,000 Hz, or a change of one volt in surface potential may result in a change of resonance frequency between 10 Hz and 1,000 Hz. Such frequency variations are easily detectible with modern electronics and enable PPM accuracy.

Figure 2A:
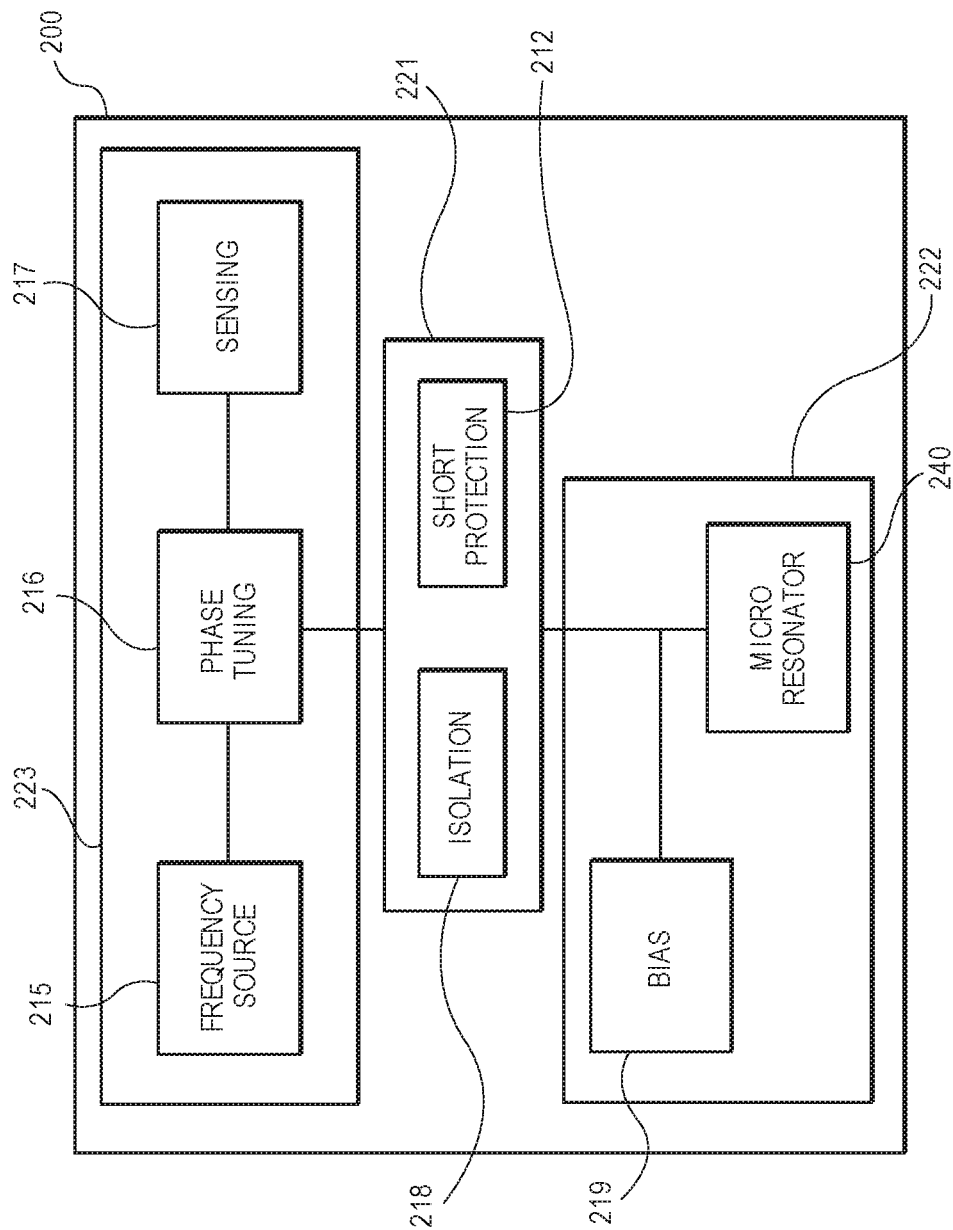
FIG. 2A is a schematic of circuitry on a diagnostic substrate for operating the micro resonator sensors, in accordance with an embodiment.

Referring now to FIG. 2A, a schematic illustration of circuitry for a diagnostic substrate illustrating various circuitry blocks that may be used to drive and/or sense micro resonators 240 is shown, in accordance with an embodiment. In an embodiment, one or more of the circuitry blocks may be located in the processing region 135. In other embodiments, the circuitry blocks may be located at any location of the diagnostic substrate 100. In a particular embodiment, the circuitry blocks may be segregated into a high voltage region 222 and a low voltage region 223. For example, the low voltage region 223 may be located in the one or more processing regions 135, and the high voltage region 222 may be located in the sensing regions 120.

In an embodiment, the high voltage region 222 may comprise circuitry blocks that operate at relatively high voltages (e.g., greater than 5V and up to hundreds of volts). For example, the micro resonator 240 may operate at high voltages in order to provide improved signal to noise ratios.

The micro resonator 240 may be supplied with a bias voltage from a biasing circuitry block 219, which is also located in the high voltage region 214. In other embodiments, what is referred to as the "high voltage region" 222 may also include no active circuitry. In such embodiments, the operation of the micro resonator 240 may be driven using wireless power sources (e.g., acoustic, optical, inductive, etc.).

In an embodiment, the high voltage region 222 may be decoupled from the low voltage region 223 by a decoupling circuitry block 221. In an embodiment, the decoupling circuitry block may include a bias voltage isolation circuitry block 218. For example, the bias voltage isolation circuitry block 218 may comprise one or more capacitors. In other embodiments, the high voltage region 222 may be segregated from the low voltage region 223 by being fabricated on different substrates (e.g., different wafers). The segregation of the low voltage region 223 from the high voltage region 222 allows for standard low voltage components to be used for the signal generation and sensing. For example, the low voltage region 223 may operate at voltages below 5V. 5V is typical of the maximum voltage of CMOS components that are utilized for signal generation and sensing. To provide additional protection, some embodiments may also include a bias shorting protection block 212 in the decoupling circuitry block 221. A bias shorting protection block 212 provides protection against the micro resonator 240 shorting to other components and permanently damaging the device.

In an embodiment, a frequency signal generator circuitry block 215 may be located in the low voltage region 213. The frequency signal generator circuitry block 215 may provide a drive signal to the micro resonator 240. For example, the drive signal may comprise a frequency sweep signal (also referred to as a "chirp"), a ping, or the like. The drive signal causes oscillation of the micro resonator 240. The oscillation of the micro resonator 240 may be sensed by the sensing circuitry block 217. For example, the oscillation may result in an impedance change in the circuit (e.g., when a chirp is used), or the oscillations may simply be counted (e.g., when a ping is used).

In some embodiments, a phase tuning circuitry block 216 may also be included to improve the precision of the measurement of the micro resonator 240. Particularly, since the phase response before/after resonance is off by 180 degrees, frequency source variation (e.g., jitter, etc.) leads to the cancellation of the response. Accordingly, a phase tuning circuitry block 216 may be used to reduce the 180 degree phase shift of adjacent frequencies before being sensed by the sensing circuitry block so that all response signals are in the same phase. That is, the phase tuning may comprise aligning the phase over a period of time of a frequency response generated by the resonating body. In an embodiment, the phase tuning circuitry block 216 may provide a complete (or nearly complete) correction of the 180 degree phase shift. In other embodiments, the 180 degree phase shift may be reduced (e.g., to less than a 90 degree phase shift). This allows for a more precise measurement since the frequency source variation inherent to the system will not result in cancellation of the response.

Figure 2B:
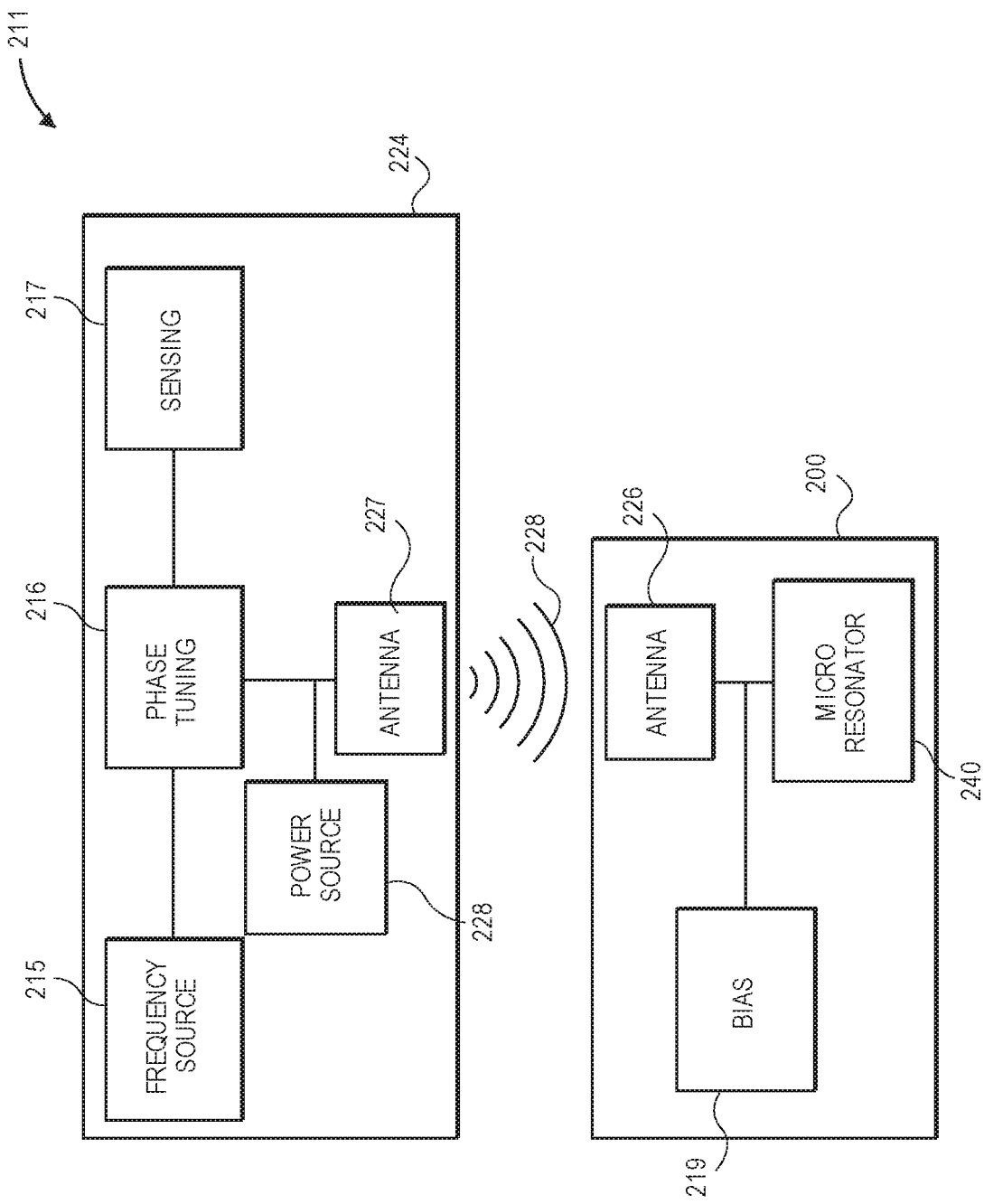
FIG. 2B is a schematic of circuitry on a diagnostic substrate and an external device for operating the micro resonator sensors, in accordance with an embodiment.

Referring now to FIG. 2B, a schematic illustration of circuitry for a system 211 for interrogating a diagnostic substrate is shown, in accordance with an embodiment. In an embodiment, the system 211 may include a diagnostic substrate 200 and an interrogation device 224. The diagnostic substrate 200 may comprise a micro resonator 240 and an antenna 226 for providing a wireless link to the interrogation device 211. In some embodiments, the diagnostic substrate 200 may also comprise a biasing circuitry block 219. In other embodiments, the diagnostic substrate 200 may only comprise passive components. That is, no active components may be included on the diagnostic substrate 200.

In an embodiment, the interrogation device 224 may comprise a frequency source circuitry block 215, a phase tuning circuitry block 216, a sensing circuitry block 217, a power source 228, and an antenna 227. For example, the low voltage components described above with respect to FIG. 2A may be included on the interrogation device 224.

In an embodiment, the antenna 226 of the diagnostic substrate 200 may be communicatively coupled to an antenna 227 on the interrogation device 224. Accordingly, a wireless link 228 between the diagnostic substrate 200 and the interrogation device 224 may be provided in the system 211. The wireless link 228 may include any wireless protocol or medium. For example, the wireless link 228 may include acoustic coupling, inductive coupling, optical coupling, radio frequency (RF) coupling, or the like.

In an embodiment, the wireless link 228 provides a data path to deliver a drive signal from the frequency source circuitry block 215 to the micro resonator 240. The wireless link 228 may also deliver a response from the micro resonator 240 to the sensing circuitry block 217. While a single antenna 227 or 226 is shown on each component, it is to be appreciated that embodiments may include separate antennas for sending and receiving information on each component.

In an embodiment, the wireless link 228 may also provide a path for wireless power to be delivered to the diagnostic substrate 200. For example, the wireless link 228 may include a base signal for delivering power, and a data signal (e.g., comprising the drive signal) may be superimposed over the base signal. As such, the diagnostic substrate 200 may be entirely passive and have no need for a dedicated on board power source. Such embodiments therefore, allow for continuous operation without the need for recharging or replacing batteries.

Figure 3A:
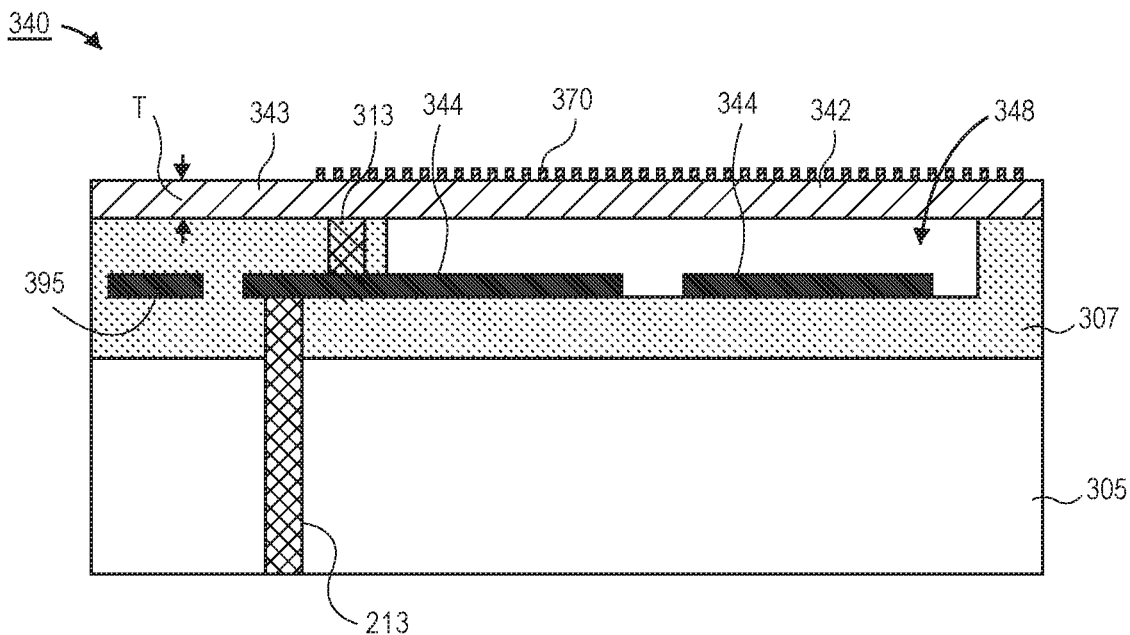
FIG. 3A is a cross-sectional illustration of a micro resonator with a diaphragm formed over a cavity, in accordance with an embodiment.

Referring now to FIG. 3A, a cross-sectional illustration of a micro resonator sensor 340 is shown, in accordance with an embodiment. The micro resonator sensor 340 may be formed over and into a circuit layer 307 formed over the substrate 305. In an embodiment, the circuit layer 307 may comprise layers of insulating and conductive materials (e.g., traces, vias, etc.). While referred to herein as a "circuit layer" 307, it is to be appreciated that the circuit layer 307 may comprise only passive components in some embodiments. In other embodiments, the circuit layer 307 may include active components as well. In an embodiment, the micro resonator sensor 340 includes a capping layer 343 over the circuit layer 307. In some embodiments, the capping layer 343 may be a pristine semiconductor layer. For example, the capping layer 343 may be silicon. In an embodiment, the capping layer 343 may have a thickness T. For example, the thickness T may be between 1 micron and 100 microns. In an embodiment, the capping layer 343 may comprise a diaphragm 342 that extends over the cavity 348 formed into the circuit layer 307. That is, the diaphragm 342 may be considered to be part of the capping layer 343, and does not extend up from the capping layer 343. It is to be appreciated that the thin film-diaphragm 342 is one example of a micro resonator sensor 340. Embodiments include any resonator system. For example, the micro resonator 340 may include cantilevered beams, comb drives or the like.

The diaphragm 342 may be driven to a resonant frequency by a plurality of electrodes 344 formed on a bottom surface of the cavity 348. In an embodiment, the plurality of electrodes 344 may be electrically coupled to the processing region 135 (not shown in FIG. 2) by electrical traces and vias 313. In an embodiment, a through substrate via 313 may be used to electrically coupled the electrodes 344 to a backside surface of the substrate 305. In an embodiment, the electrodes 244 may be electrically coupled to the capping layer 242 with one or more vias 213, traces, or the like. In an embodiment, the plurality of electrodes 344 may be drive/sense electrodes. As such, the electrodes 344 may be used to drive the diaphragm 342 and to detect the resonance frequencies of the diaphragm 342 during the processing of the diaphragm 342. In an embodiment, the plurality of electrodes 344 may use capacitance to drive the diaphragm 342. However, it is to be appreciated that the resonance of the micro resonator 340 may be obtained with any suitable mechanism. For example, the micro resonator 240 may be driven with magnetic drive systems, thermal systems, acoustic systems, optical systems, or the micro resonator 340 may include piezo electric materials that induce resonance.

In an embodiment, a patterning mask 370 may be formed over the diaphragm 342. The patterning mask 370 may be used to mask portions of the diaphragm 342 from a processing environment, such as an etching environment. During the processing operation that is being investigated with the diagnostic substrate 100, the pattern of the patterning mask 370 may be transferred into the diaphragm. As the diaphragm 342 is processed (e.g., etched), the resonance frequencies of the diaphragm 342 will change in predictable ways. The changes in resonance frequencies may then be used to calculate the physical changes in the diaphragm 342, as will be described in greater detail below.

In some embodiments, a passive coupling antenna 395 may be used to wirelessly drive and sense the resonance of the micro resonator sensor 340. For example, the antenna 395 may be formed in the circuit layer 207, or in the substrate 305. The use of a passive coupling antenna 395 allows for the contactless communication of the resonance frequencies to an external device and/or for contactless power delivery. Additionally, in some embodiments no active devices are included in the diagnostic substrate 300 when a passive coupling antenna 395 is associated with each micro resonator sensor 340.

Figure 3B:
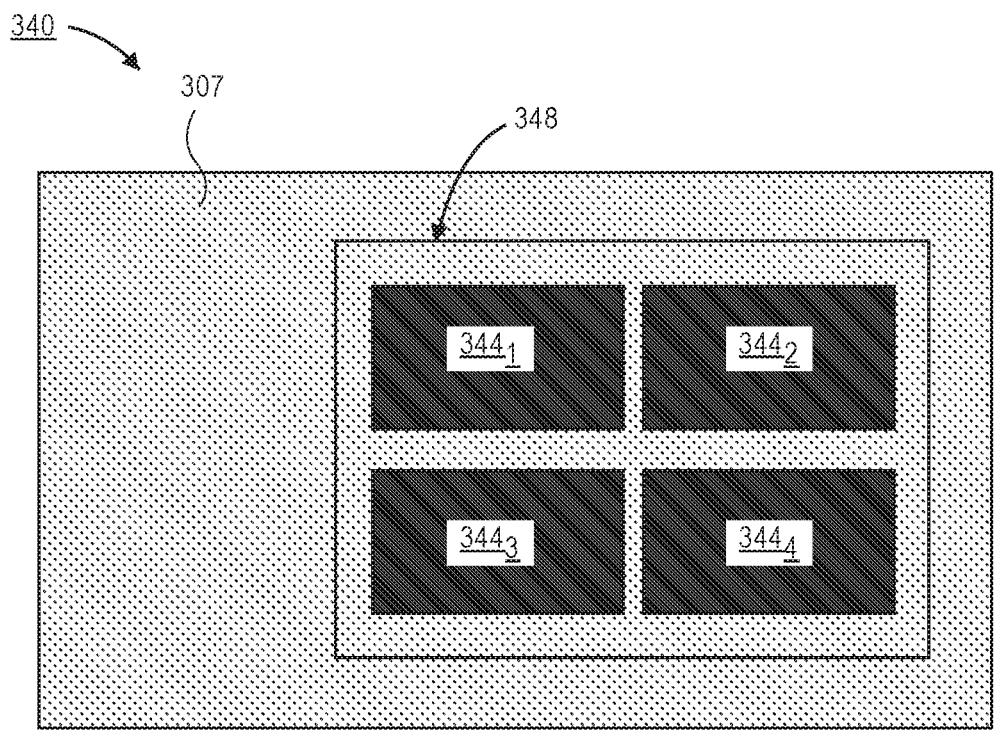
FIG. 3B is a plan view of a plurality of electrodes formed in the cavity of a micro resonator, in accordance with an embodiment.

Referring now to FIG. 3B, a plan view illustration of the cavity 348 in the circuit layer 307 is shown, in accordance with an embodiment. In the illustrated embodiment, the cavity 348 includes a rectangular shape. However, embodiments are not limited to such configurations, and the cavity 348 may be any desired shape, such as a square, circular, elliptical, or any other desired shape. As shown, the plurality of electrodes 344 are formed in the cavity 348. In embodiments, the number and arrangement of the electrodes 344 allows for different resonance modes to be induced in the diaphragm 242. The diaphragm 242 is not shown in FIG. 3 in order to not obscure the underlying features.

In the illustrated embodiment, four electrodes are shown. When four electrodes are included in the cavity 348, the diaphragm may be driven to at least three different resonance modes. A first resonance mode may be obtained by activating all four electrodes $344_1$-$344_4$ in unison. A second resonance mode may be obtained by alternating the activation of electrodes $344_1$ and $344_2$ with the activation of electrodes $344_3$ and $344_4$. A third resonance mode may be obtained by alternating the activation of electrodes $344_1$ and $344_3$ with the activation of electrodes $344_2$ and $344_4$. It is to be appreciated that additional resonance modes may be obtained by activating different combinations of electrodes 344.

Figure 4:
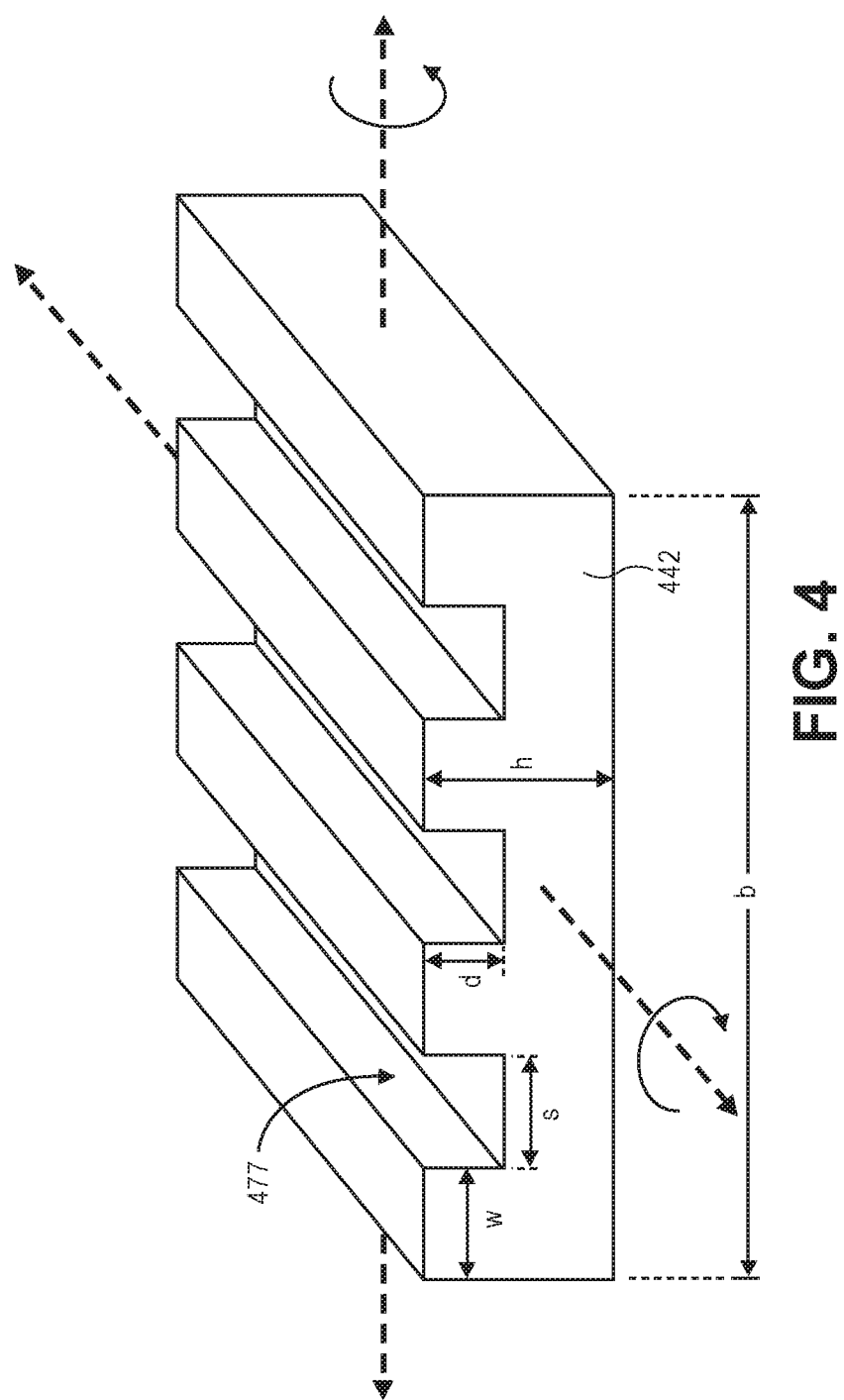
FIG. 4 is a perspective illustration of a pattern formed in the diaphragm of a micro resonator, in accordance with an embodiment.

Referring now to FIG. 4, a perspective illustration of the diaphragm 442 is shown after being processed with a processing operation. The diaphragm 442 is shown in isolation in order to not obscure the figure. In an embodiment, the second resonant mode results in the diaphragm 442 bending about a line parallel to the direction of the trenches 477. In an embodiment, the third resonance mode results in the diaphragm 442 bending about a line perpendicular to the direction of the trenches 477. Initially, prior to etching the diaphragm that is substantially square, the resonant frequencies of the second and third resonance modes will be substantially uniform (since there are no trenches formed). After the trenches begin to be formed, the resonant frequencies of the second and third resonance modes begin to diverge. In a simplified lump model, the resonant frequency ω of the diaphragm is proportional to the moment of inertia I, as shown in Equation 1 where E is the modulus and m is the mass. Accordingly, as the moment of inertia I of each bending direction changes, so does the resonant frequency.

$$\omega \sim \sqrt{\frac{EI}{m}} \qquad \text{Equation 1}$$

The divergence of the resonant frequencies of the second and third resonance modes is the result of the moment of inertia about each bending direction changing in response to the changes in the topography of the diaphragm 442. Equations for calculating the moment of inertia about each bending direction can be modeled for expected topographies and even more accurate models may be numerically solved. For example, in a square diaphragm with a series of parallel trenches with a 1:1 trech:ridge ratio, the moment of inertia $I_{PARALLEL}$ is shown in Equation 2 and the moment of inertia $I_{PERPENDICULAR}$ is shown in Equation 3. It is to be appreciated that the equations disclosed herein are simplified lump models. Equations 1 and 2 do, however, illustrate magnitudes of various variables of the process. For example, the depth d in $I_{PERPENDICULAR}$ is cubed, whereas the d in the $I_{PARALLEL}$ is not raised to a higher power. Since the resonant frequencies for each mode are determined from the micro resonator sensor, the system of equations may then be solved to determine the missing parameters that provide the topography of the diaphragm 442.

$$I_{PARALLEL} = \frac{bh^3}{12} - \frac{bdh^2}{8} \qquad \text{Equation 2}$$

$$I_{PERPENDICULAR} = \frac{b(h-d)^3}{12} \qquad \text{Equation 3}$$

Figure 5A:
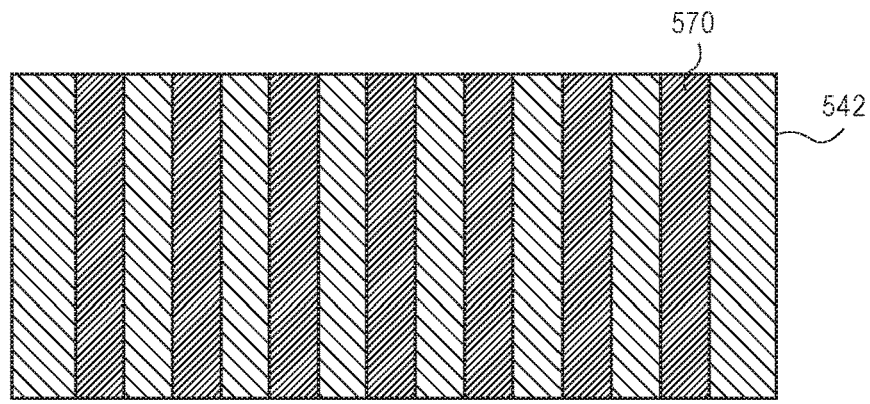
FIG. 5A is a plan view of a mask pattern formed over the diaphragm of the micro resonator, in accordance with an embodiment.
Figure 5B:
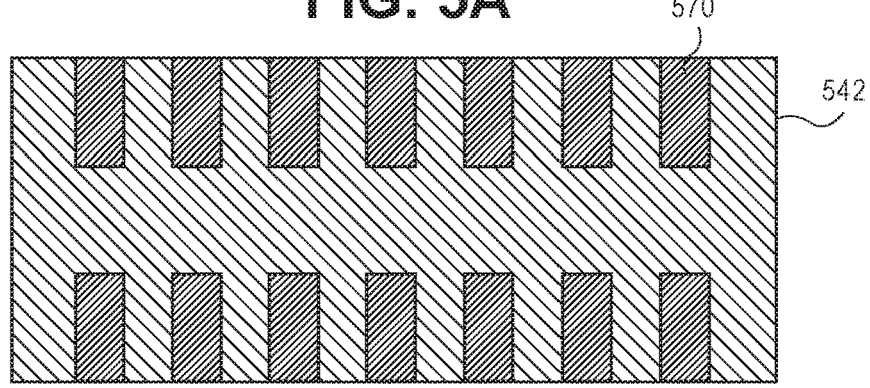
FIG. 5B is a plan view of a mask pattern formed over the diaphragm of the micro resonator, in accordance with an additional embodiment.
Figure 5C:
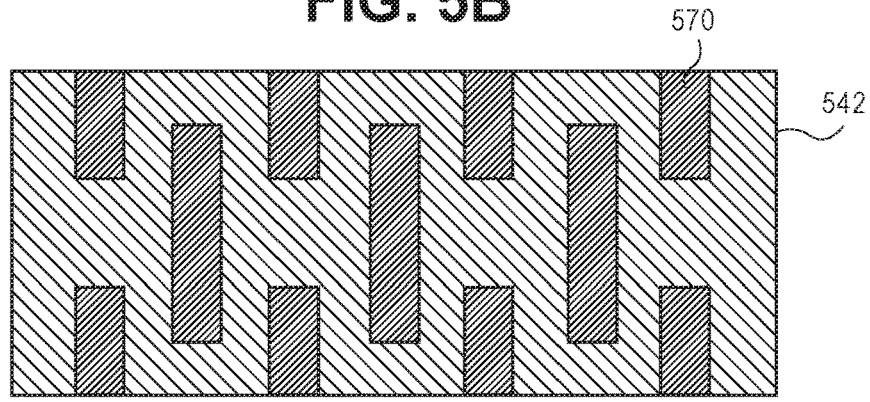
FIG. 5C is a plan view of a mask pattern formed over the diaphragm of the micro resonator, in accordance with an additional embodiment.
Figure 5D:
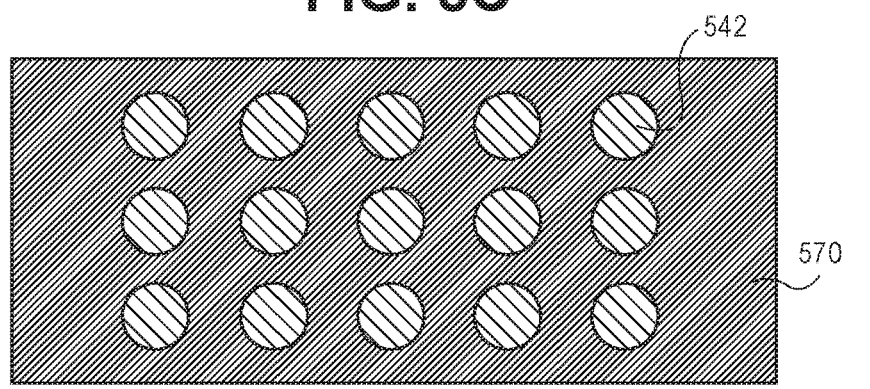
FIG. 5D is a plan view illustration of a mask pattern formed over the diaphragm of the micro resonator, in accordance with an additional embodiment.

While the scenario of parallel trenches is provided above, it is to be appreciated that embodiments may include any patterned topography. For example, FIGS. 5A-5C provide exemplary illustrations of different mask patterns 570 that may be transferred into the diaphragm 542. In FIG. 5A, a series of parallel trenches are shown. In FIG. 5B, a pattern 570 with discontinuous trenches is shown. Furthermore, FIG. 5C illustrates a pattern 570 for forming interdigitated trenches is shown. In FIG. 5D, a pattern 570 for forming a plurality of holes is shown. While FIGS. 5A-5D provide a few examples of mask patterns 570, it is to be appreciated that any pattern may be used in accordance with embodiments described herein. In order to use a pattern, embodiments only require that a model of moments of inertia for a plurality of resonance modes be generated. For example, the modeled moments of inertia may include computer generated models that are far more complex than the examples provided in Equations 1-3. Furthermore, as the complexity of the model is increased, and the number of resonance modes increased, finer details of the topography of the diaphragm may be obtained. For example, the taper of a trench may be determined, the presence of undercuts or footings may be determined, or the like.

Figure 6A:
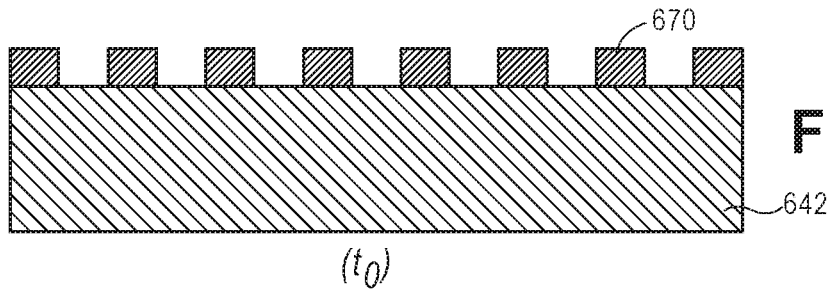
FIG. 6A is a cross-sectional illustration of a mask pattern formed over the diaphragm at a time $t_0$, in accordance with an embodiment.
Figure 6B:
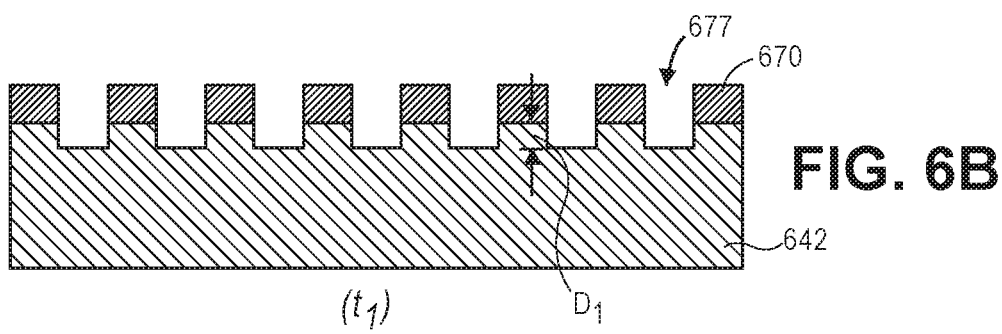
FIG. 6B is a cross-sectional illustration of the diaphragm at a time $t_1$, in accordance with an embodiment.
Figure 6C:
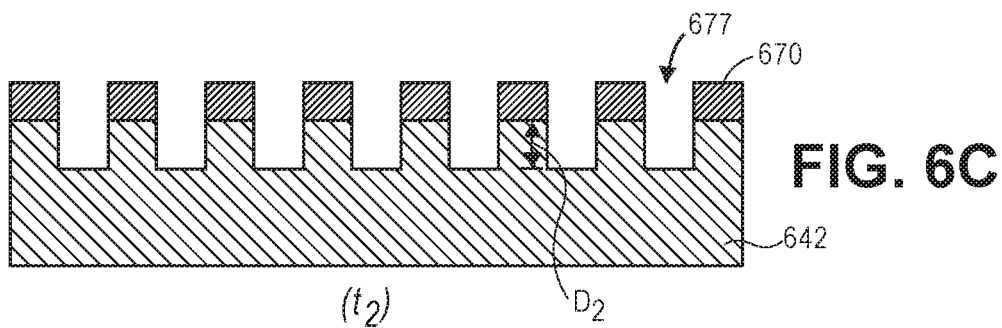
FIG. 6C is a cross-sectional illustration of the diaphragm at a time $t_2$, in accordance with an embodiment.
Figure 6D:
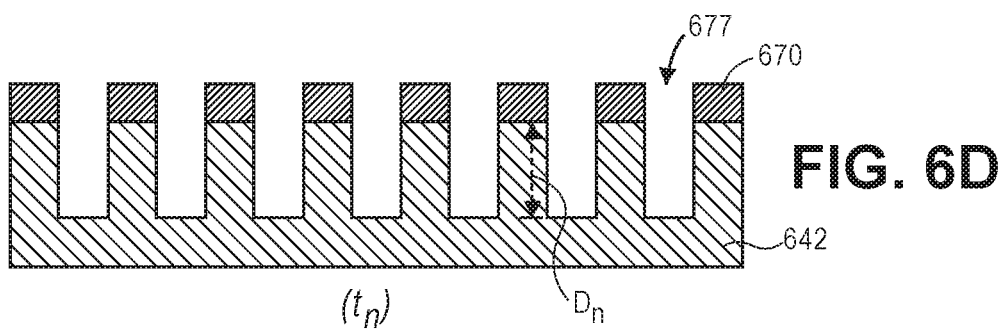
FIG. 6D is a cross-sectional illustration of the diaphragm at a time $t_n$, in accordance with an embodiment.
Figure 7:
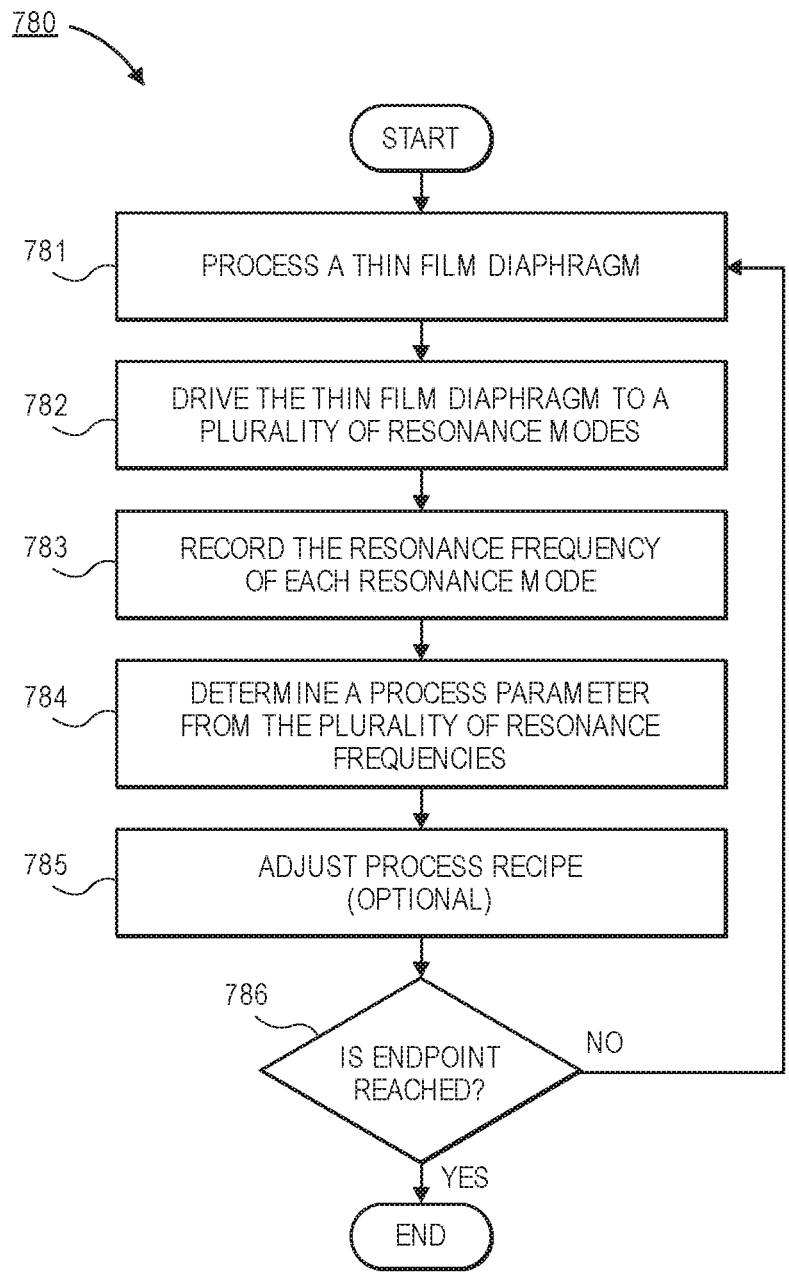
FIG. 7 is a process flow of a process for determining process parameters of a processing operation, in accordance with an embodiment.

Referring now to the cross-sectional illustrations in FIGS. 6A-6D and corresponding flow diagram in FIG. 7, a method for determining a process parameter of a processing operation is shown and described, in accordance with an embodiment. In FIGS. 6A-6D the patterned surface is referred to as being a diaphragm 642.

FIG. 6A is a cross-sectional illustration of a diaphragm 642 with a mask pattern 670 formed over the surface, in accordance with an embodiment. The diaphragm 642 may be a portion of a micro resonator sensor in a diagnostic substrate, such as one described above. In the illustrated embodiment, the diaphragm 642 is shown at time $t_{(0)}$ prior to any processing.

Referring now to FIG. 7, the process 780 may begin with operation 781 which includes processing the diaphragm 642. The processed diaphragm 642 after a time $t_{(1)}$, is shown in FIG. 6B. In an embodiment, processing the diaphragm 642 may include any processing operation that is being investigated with the diagnostic substrate. For example, the processing operation may be an etching process, a deposition process, a polishing process, an implantation process, or any other process that alters the topography of the diaphragm 642.

Referring now to operation 782, process 780 may continue with driving the diaphragm 642 to a plurality of resonance modes by applying a drive signal to the micro resonator. For example, the drive signal may comprise a frequency sweep (also referred to as a "chirp"), a ping, or the like. The drive signal causes oscillation of the diaphragm 642. The oscillation of the diaphragm 642 may be sensed by a sensing circuitry block (not shown). For example, the oscillation may result in an impedance change in the circuit (e.g., when a chirp is used), or the oscillations may simply be counted (e.g., when a ping is used). In an embodiment, the diaphragm 642 may be driven to a plurality of resonance modes with electrodes in the micro resonator sensor. In a particular embodiment, the diaphragm 642 may be driven to a first resonance mode, a second resonance mode, and a third resonance mode.

Referring now to operation 783, process 780 may continue with recording the resonance frequency of each of the plurality of resonance modes. In an embodiment, the resonance frequencies of each of the resonance modes may be recorded in a memory that is local to the diagnostic substrate. In an additional embodiment, the resonance frequencies may be transmitted to an external memory, (e.g., with a wireless communication module on the diagnostic substrate).

Referring now to operation 784, process 780 may continue with determining a process parameter from the plurality of resonance frequencies. In an embodiment, the process parameter may include an etch depth, a width of a trench, a profile of a trench wall, a thickness of a deposited layer, or any other change in the diaphragm 642. The process parameter may be determined by using the plurality of resonance frequencies and models for the moments of inertia for each of the bending directions of the resonance modes, similar to the process described above with respect to FIG. 4.

Referring now to operation 785, process 780 may continue with adjusting a process recipe of the processing operation. For example, temperatures, pressures, gas flows, or the like may be changed. The ability to change the processing recipe in situ allows for greater refinement of the processing operation and provides more information about the processing operation.

Referring now to operation 786 process 780 may continue with determining if an endpoint is reached. For example, the endpoint may be a desired time, a desired process parameter, or any other desired criteria. When the endpoint is not reached, the process may continue with repeating the processing operations 781-786 until the endpoint criteria is reached. For example, the process may repeat to determine the processing parameter after times $t_2$ to $t_n$ illustrated in FIGS. 6C-6D.

As noted above, the ability to determine the processing parameters in-situ allow for the rates of change of the processing parameter to be determined. Accordingly, greater detail about the processing operation under investigation may be obtained in comparison to the information obtained by performing metrology after the processing operation is completed.

Furthermore, it is to be appreciated that the process 750 may be implemented with a plurality of micro resonator sensors formed over the surface of the diagnostic substrate. For example, tens of thousands of micro resonator sensors in each of a plurality of sensing regions of the diagnostic substrate may be used in parallel to obtain uniformity information of the processing operation. In such embodiments, operation 754 may further include finding an average value of the processing parameter in each sensing region. The large quantity of micro resonator sensors in each sensing region allow for high precision and resolution due to the favorable signal to noise ratio obtained by processing the information obtained from each micro resonator.

In other embodiments, differential comparisons of resonance frequency of pairs of micro resonator sensors may be implemented. For example, differential comparisons may be used to determine temperatures, surface potentials, and/or pressures of the capping surface. Such differential comparisons may be implemented by using a pair of micro resonator sensors where one of the pair is used as a control to isolate one or more variables. For example, in the case of a surface potential, a bias may be applied to a first micro resonator and the second micro resonator sensor may be shorted (i.e., no bias is applied) to isolate the surface potential variable.

Figure 8:
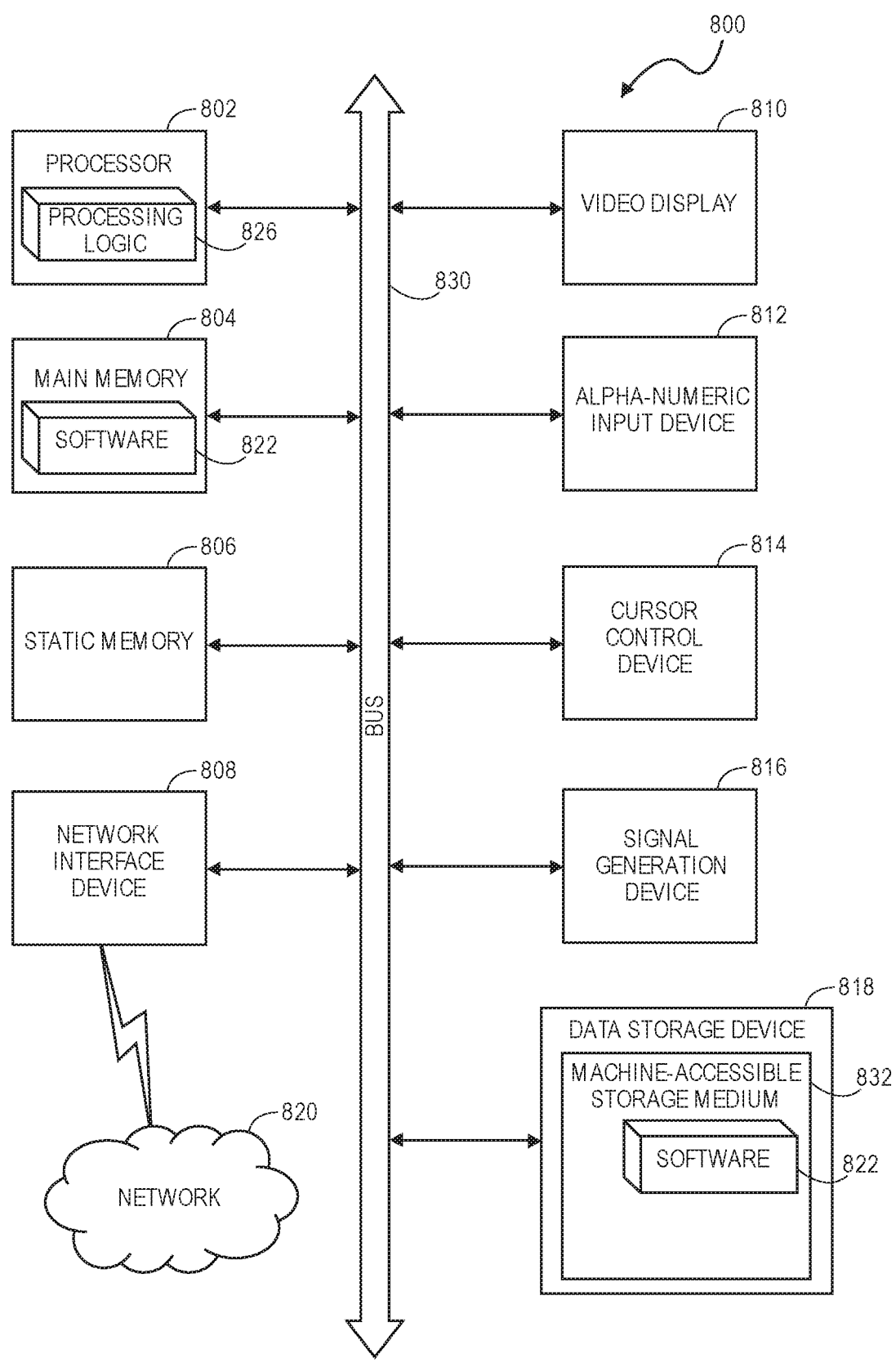
FIG. 8 illustrates a block diagram of an exemplary computer system that may be used in conjunction with processes for determining process parameters of a processing operation, in accordance with an embodiment.

Referring now to FIG. 8, a block diagram of an exemplary computer system 860 of a processing tool is illustrated in accordance with an embodiment. In an embodiment, computer system 860 is coupled to and controls processing in the processing tool. Computer system 860 may be connected (e.g., networked) to other machines in a Local Area Network (LAN), an intranet, an extranet, or the Internet. Computer system 860 may operate in the capacity of a server or a client machine in a client-server network environment, or as a peer machine in a peer-to-peer (or distributed) network environment. Computer system 860 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 860, the term "machine" shall also be taken to include any collection of machines (e.g., computers) that individually or jointly execute a set (or multiple sets) of instructions to perform any one or more of the methodologies described herein.

Computer system 860 may include a computer program product, or software 822, having a non-transitory machine-readable medium having stored thereon instructions, which may be used to program computer system 860 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 860 includes a system processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

System processor 802 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 802 may also be one or more special-purpose processing devices such as an application specific integrated circuit (ASIC), a field programmable gate array (FPGA), a digital signal system processor (DSP), network system processor, or the like. System processor 802 is configured to execute the processing logic 826 for performing the operations described herein.

The computer system 860 may further include a system network interface device 808 for communicating with other devices or machines. The computer system 860 may also include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium 831 (or more specifically a computer-readable storage medium) on which is stored one or more sets of instructions (e.g., software 822) embodying any one or more of the methodologies or functions described herein. The software 822 may also reside, completely or at least partially, within the main memory 804 and/or within the system processor 802 during execution thereof by the computer system 860, the main memory 804 and the system processor 802 also constituting machine-readable storage media. The software 822 may further be transmitted or received over a network 820 via the system network interface device 808. In an embodiment, the network interface device 808 may operate using RF coupling, optical coupling, acoustic coupling, or inductive coupling.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A diagnostic substrate, comprising:
   a substrate;
   a circuit layer over the substrate;
   a cavity in the circuit layer;
   a capping layer over the circuit layer;
   a resonating body in or over the cavity;
   one or more electrodes in the cavity; and
   circuitry for driving and sensing the resonant frequency of the resonating body, wherein the circuitry comprises:
      a biasing circuitry block configured to provide a bias voltage to the one or more electrodes;
      a frequency generator circuitry block configured to provide a signal with a varying frequency to the one or more electrodes; and
      a sensing circuitry block configured to detect a value correlated to oscillation of the resonating body.

2. The diagnostic substrate of claim 1, wherein the circuitry further comprises: a bias shorting protection circuitry block.

3. The diagnostic substrate of claim 2, wherein the circuitry further comprises:
   a biasing isolation circuitry block between the sensing circuitry block and the biasing circuitry block, wherein the biasing isolation circuitry block electrically decouples a high voltage region from a low voltage region.

4. The diagnostic substrate of claim 3, wherein the biasing isolation circuitry block comprises one or more capacitors.

5. The diagnostic substrate of claim 3, wherein the high voltage region is on a different substrate than the low voltage region.

6. The diagnostic substrate of claim 1, wherein the circuitry further comprises:
   a phase tuning circuitry block, wherein the phase tuning circuitry block is configured to tune the frequency response of the resonating body before being sensed by the sensing circuitry block.

7. The diagnostic substrate of claim 6, wherein tuning the frequency response comprises aligning the phase over a period of time of a frequency response generated by the resonating body.

8. The diagnostic substrate of claim 1, wherein the sensing circuitry block outputs one or more signals to a computing system.

9. The diagnostic substrate of claim 1, wherein the diagnostic substrate is configured to receive power and data over a single wireless link.

10. The diagnostic substrate of claim 9, wherein the single wireless link utilizes inductive coupling, acoustic coupling, optical coupling, thermal coupling, or radio frequency (RF) coupling.

11. A device for wirelessly coupling to a diagnostic substrate having a micro resonator, the device, comprising:
    a frequency source for generating a drive signal that is transmitted to the micro resonator;
    a phase tuning circuitry block, wherein the phase tuning circuitry block corrects phase mismatch of a frequency response generated by the micro resonator in response to the drive signal, wherein the phase tuning circuitry block provides a 180 degree phase shift correction; and
    a sensing circuitry block, wherein the sensing circuitry block is configured to detect a change in a value correlated to the frequency response received from the micro resonator.

12. The device of claim 11, wherein wirelessly coupling to the diagnostic substrate comprises a wireless link for wirelessly transmitting the drive signal to the micro resonator and wirelessly receiving the frequency response from the micro resonator.

13. The device of claim 12, wherein the wireless link utilizes acoustic coupling, inductive coupling, radio frequency (RF) coupling, thermal coupling, or optical coupling.

14. The device of claim 11, wherein the wireless link further provides wireless power to the micro resonator.

15. The device of claim 14, wherein a signal transmitted over the wireless link comprises a base signal for power and a data signal superimposed over the base signal, wherein the data signal comprises the drive signal.

16. A diagnostic system for determining processing parameters of a process, comprising:
    a diagnostic substrate, wherein the diagnostic substrate comprises:
       a substrate;
       a circuit layer over the substrate, wherein the circuit layer comprises insulating and conductive materials;
       a plurality of micro resonators over or in the circuit layer; and
       a biasing circuitry block configured to provide a bias voltage to one or more electrodes for driving the plurality of micro resonators; and
    an interrogation device external to the diagnostic substrate, wherein the interrogation device is configured to be wirelessly coupled to the diagnostic substrate to drive and sense the plurality of micro resonators.

17. The diagnostic system of claim 16, wherein the interrogation device comprises:
    a frequency source for generating a drive signal that is transmitted to the micro resonator;
    a phase tuning circuitry block, wherein the phase tuning circuitry block corrects phase mismatch of a frequency response generated by the micro resonator in response to the drive signal; and
    a sensing circuitry block, wherein the sensing circuitry block is configured to detect a change in a value correlated to the frequency response received from the micro resonator.

18. The diagnostic system of claim 16, wherein the diagnostic system is configured to measure one or more of a critical dimension, a film thickness, an etching depth, a mass change, a surface roughness, a temperature, a surface potential, or a pressure resulting from a processing operation implemented on the diagnostic substrate.

19. The diagnostic system of claim 18, wherein the processing operation is an etching process, a deposition process, or a polishing process, and wherein the diagnostic system is configured to control the processing operation by determining an endpoint by detecting when a layer thickness has reached a desired value.

\* \* \* \* \*